(12) United States Patent
Katampe et al.

(10) Patent No.: US 6,964,836 B2
(45) Date of Patent: Nov. 15, 2005

(54) PHOTOSENSITIVE MICROCAPSULES CONTAINING A SYNTHETIC VISCOSITY MODIFIER IN THE CONTINUOUS PHASE

(75) Inventors: Ibrahim Katampe, Kettering, OH (US); Alexander Y. Polykarpov, Mason, OH (US); Joseph C. Camillus, Centerville, OH (US)

(73) Assignee: Eastman Kodak Company, Rochester, NY (US)

( * ) Notice: Subject to any disclaimer, the term of this patent is extended or adjusted under 35 U.S.C. 154(b) by 175 days.

(21) Appl. No.: 10/099,793

(22) Filed: Mar. 15, 2002

(65) Prior Publication Data

US 2003/0175612 A1 Sep. 18, 2003

(51) Int. Cl.[7] .......................... G03F 7/033; G03F 7/09; B01J 13/02; B05D 7/00
(52) U.S. Cl. .................. 430/138; 427/213.34; 503/215
(58) Field of Search ................ 430/138, 332, 430/337, 338, 345, 281.1, 27.1, 273.1; 427/213.34; 503/215

(56) References Cited

U.S. PATENT DOCUMENTS

| | | | |
|---|---|---|---|
| 2,730,456 A | 1/1956 | Green et al. | |
| 2,800,457 A | 7/1957 | Green et al. | |
| 3,672,935 A | 6/1972 | Miller et al. | |
| 3,732,120 A | 5/1973 | Brockett et al. | |
| 3,755,190 A | 8/1973 | Hart et al. | |
| 3,796,669 A | 3/1974 | Kiritani et al. | |
| 3,914,511 A | 10/1975 | Vassiliades | |
| 3,915,921 A | 10/1975 | Schlatzer, Jr. | |
| 3,920,510 A | 11/1975 | Hatano et al. | |
| 4,001,140 A | 1/1977 | Foris et al. | |
| 4,025,455 A | 5/1977 | Shackle | |
| 4,087,376 A | 5/1978 | Foris et al. | |
| 4,089,802 A | 5/1978 | Foris et al. | |
| 4,399,209 A | 8/1983 | Sanders et al. | |
| 4,416,966 A | 11/1983 | Sanders et al. | |
| 4,440,846 A | 4/1984 | Sanders et al. | |
| 4,501,809 A | 2/1985 | Hiraishi et al. | |
| 4,509,949 A | 4/1985 | Huang et al. | |
| 4,552,811 A | * 11/1985 | Brown et al. .......... | 428/402.21 |
| 4,608,330 A | 8/1986 | Marabella | |
| 4,746,467 A | * 5/1988 | Sakamoto et al. ........... | 264/4.7 |
| 4,766,050 A | 8/1988 | Jerry | |
| 4,772,530 A | 9/1988 | Gottschalk et al. | |
| 4,772,541 A | 9/1988 | Gottschalk et al. | |
| 4,800,149 A | 1/1989 | Gottschalk et al. | |
| 4,842,980 A | 6/1989 | Gottschalk et al. | |
| 4,865,942 A | 9/1989 | Gottschalk et al. | |
| 4,879,287 A | * 11/1989 | Orr et al. .................... | 514/171 |
| 4,912,011 A | 3/1990 | Yamamoto et al. | |
| 4,962,010 A | 10/1990 | Colyer et al. | |
| 4,977,060 A | * 12/1990 | Liang et al. ................ | 430/138 |
| 5,057,393 A | 10/1991 | Shanklin et al. | |
| 5,071,823 A | 12/1991 | Matsushita et al. | |
| 5,091,280 A | 2/1992 | Yamaguchi et al. | |
| 5,100,755 A | 3/1992 | Shanklin | |
| 5,112,752 A | 5/1992 | Johnson et al. | |
| 5,230,982 A | 7/1993 | Davis et al. | |
| 5,496,891 A | * 3/1996 | Stead et al. .............. | 525/330.2 |
| 5,516,621 A | 5/1996 | Tsuda et al. | |
| 5,567,579 A | 10/1996 | Gourlaouen et al. | |
| 5,783,353 A | 7/1998 | Camillus et al. | |
| 5,809,164 A | 9/1998 | Hultgren, III | |
| 5,866,311 A | 2/1999 | Droin et al. | |
| 5,955,237 A | 9/1999 | Hattori et al. | |
| 6,080,520 A | * 6/2000 | Polykarpov et al. ........ | 430/138 |
| 6,087,080 A | 7/2000 | Gavney, Jr. et al. | |
| 6,127,084 A | 10/2000 | Katampe et al. | |
| 6,136,042 A | 10/2000 | Maubru | |
| 6,620,571 B2 | * 9/2003 | Katampe et al. ............ | 430/138 |

FOREIGN PATENT DOCUMENTS

| | | |
|---|---|---|
| JP | 02-096162 | 4/1990 |
| JP | 10-301269 | 11/1998 |
| WO | 95/34845 | 12/1995 |
| WO | 99/46642 | 9/1999 |

OTHER PUBLICATIONS

*Bulletin 3: Nomenclature and Chemistry*, Noveon, Inc. (Jan. 2002).
*Carbopol® Polymeric Thickeners Carbopol ETD™ 2691*, Noveon, Inc. (date unknown).
*Pemulen Resins—The Universal Emulsifier for Oil–in–Water Emulsions*, Noveon, Inc. (1998).
*Carbopol Resins for Efficient and Effective Thickening, Stabilizing and Suspending*, Noveon, Inc. (1998).
*Introducing Pemulen® Polymeric Emulsifiers*, Noveon, Inc. (Jan. 2002).
*Module 6–3 Photographic Recording Mediums*, The Center for Occupational Research and Development (1987).
*Carbopol® Polymeric Thickeners, Carbopol EZ–2*, Noveon, Inc. (date unknown).
*Carbopol® Polymric Thickeners, Carbopol® ETD™ 2623*, Noveon, Inc. (date unknown).
*Carbopol® Polymeric Thickeners, Carbopol® 676*, Noveon, Inc. (date unknown).
*Carbopol® Polyermic Thickeners, Carbopol EZ–1*, Noveon, Inc. (date unknown).

* cited by examiner

Primary Examiner—Richard L. Schilling
(74) Attorney, Agent, or Firm—Sarah Meeks Roberts

(57) ABSTRACT

A process for forming photosensitive microcapsules having discrete capsule walls comprising the steps of forming an emulsion of an oily core material in a continuous aqueous phase containing a carboxyvinyl polymer and enwrapping particles of the oily core material in an amine-formaldehyde condensation product produced by in situ condensation of an amine and formaldehyde wherein the carboxyvinyl polymer comprises a crosslinked polymer of acrylic acid is disclosed.

20 Claims, 5 Drawing Sheets

PHOTOSENSITIVE MICROCAPSULES CONTAINING A SYNTHETIC VISCOSITY MODIFIER IN THE CONTINUOUS PHASE

BACKGROUND OF THE INVENTION

The present invention relates to photosensitive microcapsules and, more particularly, to an improved method for producing microcapsules wherein a synthetic viscosity modifier is incorporated in the continuous phase. Particularly useful synthetic viscosity modifiers include crosslinked polymers of acrylic acid which provide the desired degree of predictable viscosity control such that the proper particle size can be achieved during emulsification and the viscosity of the finished coating can subsequently be reduced to facilitate coating.

Imaging materials employing photosensitive microcapsules are the subject of commonly assigned U.S. Pat. Nos. 4,399,209 and 4,440,846. In the aforesaid commonly assigned U.S. patents, images are formed by image-wise exposing a layer of photosensitive capsules to actinic radiation and rupturing the capsules typically by passing the imaging sheet containing the capsules through a pressure nip. The radiation sensitive composition contains a photohardenable or photosoftenable material which undergoes a change in viscosity upon exposure. For example, in the most typical embodiments, the radiation sensitive composition contains a polyethylenically unsaturated monomer which polymerizes upon exposure, thereby causing the phase internal to the capsules to become harder. Due to the difference in the hardness of the capsules in the exposed versus the unexposed areas, only certain capsules rupture and release their contents. If the internal phase contains a dye precursor, the precursor is image-wise released, and a color image is formed upon its transfer to a developer layer. In previously disclosed embodiments, the developer layer may be present on the same support as the layer of capsules or a separate support. It is advantageous if the developer is present on the same support since such a self-contained imaging sheet can be developed as an integral unit.

An image transfer system in which the developer material is coated on a separate substrate as a separate developer or copy sheet is disclosed in commonly assigned U.S. Pat. No. 4,399,209. A self-contained imaging sheet in which the encapsulated color former and the developer material are co-deposited on one surface of a single substrate as one layer or as two interactive layers is disclosed in commonly assigned U.S. Pat. No. 4,440,846. An imaging system comprising a support, a layer containing microcapsules, a layer of developer material, and a layer containing an opacifying agent is disclosed in commonly assigned U.S. Pat. No. 4,766,050. The opacifying agent can form a separate layer or can be part of the layer containing the microcapsules or both but is interposed between the microcapsules and the developer to hide the microcapsules when viewing the image. U.S. Pat. No. 5,783,353, commonly assigned, discloses a self-contained imaging system wherein the imaging layer is enclosed between two supports to form an integral unit. The laminated format is advantageous in that it can reduce oxygen and moisture permeation and improve stability of the media. U.S. patent application Ser. No. 09/761,014, filed Jan. 16, 2001, discloses a self-contained photosensitive material which includes an imaging layer of photosensitive microcapsules and a developer on a support and a protective coating on the imaging layer.

Previously, photosensitive microcapsules having a desired uniform small size have been obtained by using pectin as a system viscosity modifier alone but preferably in combination with sulfonated polystyrene. This method is the subject of commonly assigned U.S. Pat. No. 4,962,010. Pectin is derived from natural sources and is, therefore, subject to significant variations. Controlling the viscosity and, consequently, the particle size of the microcapsules, can depend on the grade and even the batch of pectin being used. Furthermore, prior to coating, the viscosity of the microcapsule-containing coating composition must be reduced to levels suitable for the particular coating process. Viscosity reduction of coating compositions containing pectin-based viscosity modifiers depends on alkali deesterification of the pectin. Sodium hydroxide is typically used for this process and can result in a high pH medium which can interfere with development of the encapsulated color formers during image formation. Furthermore, the concentration and amount of alkali required to achieve the desired viscosity level depends on the degree of esterification of the pectin, which, as noted above, can vary significantly.

SUMMARY OF THE INVENTION

In accordance with the present invention, photosensitive microcapsules are prepared by emulsifying an oily material in an aqueous medium containing a carboxyvinyl polymer, more specifically, a crosslinked polymer of acrylic acid. In accordance with more particular embodiments of the present invention, the synthetic viscosity modifiers include polymers of acrylic acid crosslinked with polyalkenyl ethers or divinyl glycol. Microcapsules of a more uniform, controlled, small size can be obtained by incorporating a synthetic viscosity modifier in accordance with the present invention in the aqueous phase. When these microcapsules are used in forming photosensitive imaging sheets as described in the aforementioned commonly assigned patents, the imaging sheets exhibit improved film speed and a more uniform photographic response. Further, by utilizing microcapsules prepared in accordance with the present invention, imaging sheets are obtained which exhibit reduced sensitivity to variations in humidity, thereby producing more consistent and reliable images.

Photosensitive microcapsules obtained in accordance with the present invention are characterized by an average particle size in the range of about 4 to 8 microns. At least 90% of the microcapsules have a particle size less than 10 microns. In accordance with one particular embodiment of the invention microcapsules having an average particle size of about 5 microns and a size distribution of 2 to 10 microns are obtained. Because of their uniform small size these microcapsules are particularly useful in forming photosensitive imaging sheets.

Accordingly, one embodiment of the present invention relates to a process for producing photosensitive microcapsules which comprises enwrapping particles of an oily core material dispersed in a continuous aqueous phase in polymeric shells produced by in situ condensation of formaldehyde and an amine or a precondensate thereof wherein the aqueous phase contains a crosslinked polymer of acrylic acid.

Examples of viscosity modifiers useful in the present invention include crosslinked polymers of acrylic acid and crosslinked copolymers of acrylic acid and long chain alkyl acrylates. These viscosity modifiers are typically crosslinked with polyalkenyl ethers or divinyl glycol.

Another embodiment of the present invention resides in photosensitive microcapsules having a discrete capsule wall and containing, in the internal phase, a radiation sensitive composition, the microcapsules being produced by enwrapping particles of an oil-in-water emulsion containing a carboxyvinyl polymer as a viscosity modifier in a polymer produced by in situ polymerization of formaldehyde and an amine, the microcapsules having an average particle size of about 4 to 8 microns, and not less than about 90% of said capsules being less than 10 microns in size.

Still another embodiment of the present invention relates to a self-contained imaging sheet. Self-contained imaging sheets in accordance with the present invention comprise a first support, an imaging layer of the aforesaid microcapsules and a developer, and a second support. Alternatively, a protective coating on the imaging layer can be utilized in place of the second support.

The capsules may contain a photohardenable or a photosoftenable material as the radiation sensitive material. In the most typical case, the capsules contain a polyethylenically unsaturated monomer, a photoinitiator, and a dye precursor. Imaging is conducted as described in the aforementioned commonly assigned patents and application which are incorporated herein by reference.

DETAILED DESCRIPTION OF THE INVENTION

Figure 1A:
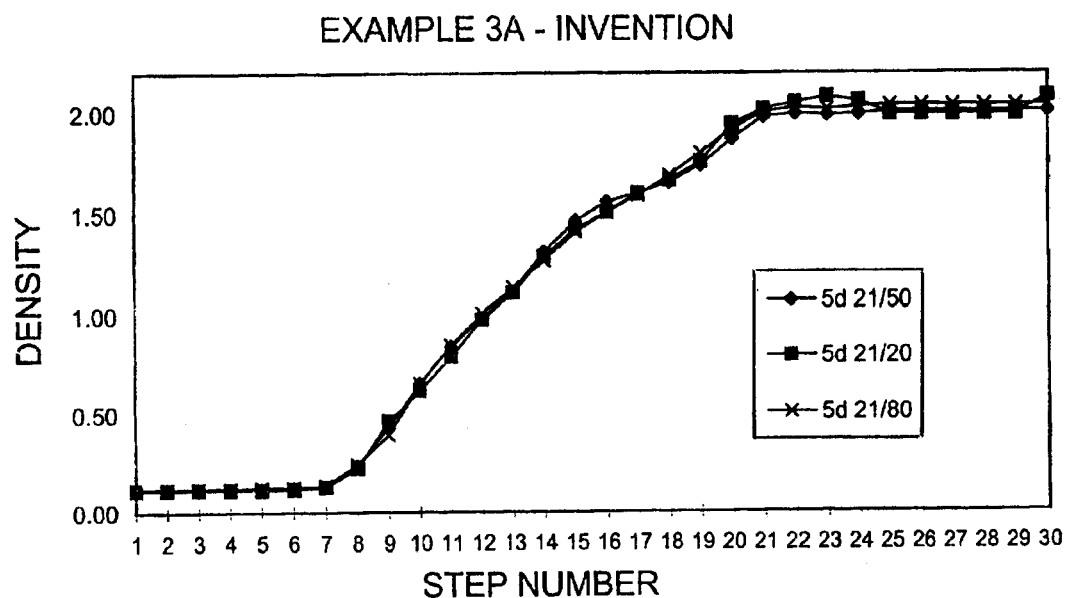
FIG. 1 illustrates the sensitometric response for microcapsules prepared in accordance with the present invention (FIG. 1a) compared to microcapsules prepared using pectin as a viscosity modifier (FIG. 1b) for cyan monochromemedia stored under various humidity conditions (20% RH, 50% RH, and 80% RH)

In accordance with the present invention, photosensitive microcapsules are prepared from an aqueous based emulsion of the oily core material wherein the aqueous phase includes a carboxyvinyl polymer. The carboxyvinyl polymers useful in accordance with the present invention are crosslinked polymers containing acrylic units and crosslinked copolymers containing acrylic units and $C_{10}$–$C_{30}$ alkyl acrylate units. More particularly, specific types of the carboxyvinyl polymers can be characterized as polymers of acrylic acid copolymerized with long chain $C_{10}$–$C_{30}$ alkyl acrylates, and crosslinked with polyalkenyl ethers or divinyl glycol. Commercially available carboxyvinyl polymers useful as viscosity modifiers in the present invention are available under the trade names Carbopol®, Noveon® and Pemulen® from Noveon. Specific examples of these crosslinked polymers useful as viscosity modifiers include, but are not limited to, Pemulen® type polymers:TR-1 and TR-2 and Carbopol® type polymers: 674, 676, 907, ETD 2691, ETD 2623, Aqua 30 and EZ-2. Pemulen® TR-1, a polymeric emulsifier characterized as a copolymer containing acrylic units and $C_{10}$–$C_{30}$ alkyl acrylate units crosslinked with allylpentaerythritol, is a particularly useful viscosity modifier. When added to the water phase, these polymers produce high clarity gels upon neutralization with either caustic or amine. The carboxyvinyl viscosity modifier is generally added to the aqueous phase in an amount of about 1.0 to 8% by weight based on the amount of water in the aqueous phase, with the preferred amount being about 2 to 4%.

The carboxyvinyl polymer useful as a viscosity modifier in accordance with the present invention can be characterized as polymers of
   a) carboxylic acids containing at least one activated carbon-to-carbon olefinic double bond and at least one carboxyl group and
   b) a crosslinking polymerizable monomer.

Specific examples of carboxylic acids include acrylic acid, methacrylic acid, ethacrylic acid and the like. Particularly useful crosslinking polymerizable monomers include polyalkenyl ethers and divinyl glycol. Specific examples of crosslinking monomers include allylpentaerythritol and allyl sucrose.

In accordance with particular embodiments of the present invention, the carboxyvinyl polymer can be prepared using an additional monomer comprising an acrylic ester wherein the ester includes an alkyl group having from 10 to 30 carbon atoms. Representative acrylates include decyl acrylate, isodecyl acrylate, lauryl acrylate, dodecyl acrylate, stearyl acrylate, and the corresponding methacrylates, decyl methacrylate, isodecyl methacrylate, lauryl methacrylate, dodecyl methacrylate, and stearyl methacrylate. Mixtures of two or three or more long chain acrylic esters may be successfully polymerized with one of the carboxylic monomers.

Polymers so prepared can be characterized as crosslinked polymers containing acrylic units and $C_{10}$–$C_{30}$ alkyl acrylate units. Crosslinked polymers prepared in this manner are described in U.S. Pat. Nos. 3,915,921 and 4,509,949, the disclosures of which are incorporated herein by reference.

The aqueous phase may also include a sulfonated polystyrene to aid in emulsification. Typical examples of sulfonated polystyrenes useful in the present invention are VERSA TL500™ and VERSA TL502B™, products of National Starch Co. Useful sulfonated polystyrenes are generally characterized by a sulfonation degree of over 85% and preferably over 95%. The molecular weight of the sulfonated polystyrene is preferably greater than 100,000 and more preferably about 500,000 but other molecular weights can also be used. The sulfonated polystyrene is usually added to the aqueous phase in an amount of about 1 to 6% by weight. The quality of this product has also been found to vary with the method by which it is manufactured such that certain sulfonated polystrenes are better than others.

Emulsification is preferably conducted under conditions which afford an emulsion having an average particle size in the range of about 3 to 10 microns. The observed particle size of the emulsion is somewhat smaller than the particle size of the capsules produced. Typically, the emulsion is prepared by adding an oily material to be encapsulated to an aqueous phase containing a carboxyvinyl polymer and sulfonated polystyrene while stirring or otherwise agitating the aqueous phase to achieve the desired emulsion particle size. The aqueous phase may also include other capsule wall forming materials in a manner well known in the art.

The capsule wall can be formed around the radiation-sensitive oil droplets in the emulsion using many known wall forming techniques.

The present invention is particularly directed to forming microcapsules in which the oily core material is enwrapped in an amine-formaldehyde condensation product. Such microcapsules are formed by in situ condensation of formaldehyde and an amine such as urea, melamine, dimethylol urea, and the like or a pre-condensate thereof. The condensation product can be modified by the co-condensation of a polyhydric phenol such as resorcinol if desired.

Microcapsules can be prepared by forming an aqueous phase containing the carboxyvinyl viscosity modifier and VERSA TL™, and adjusting the pH to suit the condensation reaction to be employed, followed by the addition of the oil phase. Generally, a pH of about 4.0 is useful in making urea-formaldehyde microcapsules whereas a pH of 6.0 is used in making melamine-formaldehyde capsules.

Blending is continued until an average emulsion particle size of about 4 to 5 microns has been achieved whereupon solutions of the amine and formaldehyde or a solution of a precondensate thereof are/is added to the emulsion and the capsule walls gradually form. After formation of the desired size microcapsules, the fluid viscosity is reduced by addition of acid. The carboxyvinyl viscosity modifiers used in accordance with the present invention provide the necessary stable viscosity during the high shear emulsification process and can be adjusted to lower viscosities required for the coating process.

Among many well known encapsulation techniques that can be used in the present invention are: Kiritani et al, U.S. Pat. No. 3,796,669 for urea-resorcinol-formaldehyde capsules; Forris et al, U.S. Pat. Nos. 4,001,140; 4,087,376 and 4,089,802 for melamine-formaldehyde capsules. The present invention can be practiced using the aforesaid techniques by incorporating a carboxyvinyl viscosity modifier and sulfonated polystyrene prior to emulsification of the oil.

The process of the invention typically involves forming an agitated aqueous solution having the core material dispersed therein and, while maintaining the dispersion, adding solutions of the amine and formaldehyde or precondensates thereof. On reaction, any amineformaldehyde condensate separates from the solution which wets and enwraps the capsule core material. After the walls have been solidified, the capsules may be separated from the medium and washed.

The mean size of the capsules produced in accordance with the present invention may vary over a broad range but generally ranges from approximately 1 to 10 microns. As a general rule, image resolution improves as the capsule size decreases with the caveat that if the capsule size is too small, the capsule may sit within incongruities in the support and the support may screen the capsules from exposure. Very small capsules may also fail to rupture upon the application of pressure. Microcapsules prepared in accordance with the present invention typically have an average particle size in the range of about 4 to 8 microns with at least 90% having a particle size less than 10 microns. In accordance with one embodiment of the present invention, microcapsules are obtained having an average particle size of about 5 microns and a size distribution of from about 2 to 10 microns.

One method in accordance with the present invention involves the following steps:
(i) Preparing an aqueous solution of carboxyvinyl polymer and sulfonated polystyrene and adjusting pH
(ii) Emulsifying the core material in the aqueous solution
(iii) Adding amine and formaldehyde or amineformaldehyde precondensate to the system
(iv) Adjusting pH
(v) Polymerizing the amine and formaldehyde while stirring the system
(vi) Heating
(vii) Reacting the excess formaldehyde.

To prepare microcapsules having melamine-formaldehyde walls, the following procedure can be used:
(i) Preparing an aqueous solution of carboxyvinyl polymer and sulfonated polystyrene and adjusting pH
(ii) Emulsifying the core material in the aqueous solution
(iii) Adding melamine-formaldehyde precondensate to the system
(iv) Adjusting pH
(v) Polymerizing pre-condensate
(vi) Heating
(vii) Reacting excess formaldehyde.

Another process involves the following sequence of steps:
(i) Emulsifying an oil in an aqueous solution containing carboxyvinyl polymer and sulfonated polystyrene
(ii) Adding an aqueous solution of urea
(iii) Adding an aqueous solution of resorcinol
(iv) Adding an aqueous solution of formaldehyde
(v) Heating to 65° C.
(vi) Adjusting the pH to 9.0
(vii) Adding a solution of sodium acid sulfite to scavenge excess formaldehyde
(viii) Removing an aqueous dispersion of the microcapsules.

The condensation reaction proceeds under acid conditions, e.g., pH of 7 or less; however, the reaction is preferably carried out at a pH in the range of 2.5 to 5.0. The temperature of the encapsulation medium should be maintained at about 10° to 95° C., preferably about 25° to 85° C. and more preferably about 45° to 75° C.

Among the acid catalysts that may be used are low molecular weight carboxylic acids, e.g., formic acid, acetic acid, etc.; inorganic acids, e.g., sulfuric acid, hydrochloric acid, phosphoric acid, etc.; and acidic or easily hydrolyzable salts such as aluminum sulfate, ammonium nitrate, ammonium chloride, ammonium sulfate, etc. Ammonium salts are preferred as they seem to provide a stronger and less permeable capsule. The ammonium salts are usually employed in an amount of about 2 to 20% by weight based on the amount of urea.

The amine and formaldehyde are preferably present in the encapsulation medium, whether as the free monomer or a precondensate, in a molar ratio of formaldehyde to amine of at least 1.5 and preferably about 2.0 to 3.0.

To reduce malodor and the incidence of skin irritation, when the polymerization reaction is complete, it is desirable to remove or react the excess formaldehyde. This can be accomplished by using any one of several known techniques such as the addition of phosphoric acid, urea, sulfite or bisulfite. These materials react with the formaldehyde to form a product which is easily removed from the medium. The addition of the urea or sodium sulfite to scavenge formaldehyde is preferably made in a single step after encapsulation and prior to storage. The pH and temperature of the medium should be adjusted for this reaction. The sulfite is preferably reacted at a pH of 6 to 8 at room temperature for about 2 hours. The urea can be reacted at a pH of 3 to 5 or 8 to 12 at a temperature of 30 to 60° C. for 4 hours.

Suitable polyhydric phenols that may be added to the reaction system for co-condensation with the amine and formaldehyde to improve impermeability are resorcinol, catechol, gallic acid, and the like. The phenols may be added in an amount of about 5 to 30% by weight based on the amount of urea.

In most cases it is desirable to add a polyisocyanate to the core material. This practice is described in detail in U.S. Pat. No. 4,353,809. The polyisocyanate is believed to react with water at the interface of the core material and the aqueous medium and form a thin layer of polymer which further stabilizes the emulsion. Preferred polyisocyanates are SF-50, an aromatic trisocyanate manufactured by Union Carbide, and Desmodur N-100, a biuret of hexamethylene diisocyanate and water available from Mobay Chemical Co. The isocyanate is typically added in an amount of about 0.005 to 3 parts per 100 parts of the core material and preferably 0.01 to 2 parts.

The process of the present invention is advantageously used to produce microcapsules for use in photographic or pressure-sensitive recording papers. In the former embodiment, the core material is typically a substantially colorless color former dissolved in an oil. In the latter embodiment, the core material is typically a photosensitive composition containing a color former.

The radiation-sensitive compositions used in the present invention undergo a change in viscosity upon exposure to actinic radiation. "Actinic radiation" includes the entire electromagnetic spectrum (e.g., U.V., I.R., Visible), x-ray and ion beam radiation. These compositions may be positive working or negative working. For example, where the radiation sensitive composition contains a photohardenable material, such as, a photopolymerizable or photocrosslinkable material, in the exposed areas the internal phase solidifies or increases in viscosity and thereby prevents the capsules from rupturing and releasing the image forming agent (e.g., a color former) associated with the capsules. In the unexposed areas, the internal phase remains liquid, the capsules rupture, and the image-forming agents are mobilized. In this manner positive images are formed. On the other hand, where the capsules contain a photosoftenable material, such as a photodepolymerizable material, exposure reduces the viscosity of the internal phase and the elements active in the image-forming process are released in the exposed areas whereby negative images are formed.

Typically, the photosensitive composition includes a photoinitiator and a substance which undergoes a change in viscosity upon exposure to light in the presence of the photoinitiator. That substance may be a monomer, dimer, oligomer or mixture thereof which is polymerized to a higher molecular weight compound or it may be a polymer which becomes crosslinked.

Typically, the substance which undergoes a change in viscosity is a free radical addition polymerizable or crosslinkable compound. The most typical example of a free radical addition polymerizable or crosslinkable compound useful in the present invention is an ethylenically unsaturated compound and, more specifically, a polyethylenically unsaturated compound. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxypentacrylate (DPHPA), hexanediol-1,6-dimethacrylate, and diethylene glycol dimethacrylate.

Another group of substances useful as radiation sensitive compositions include isocyanate modified acrylic, methacrylic and itaconic acid esters of polyhydric alcohols as disclosed in U.S. Pat. Nos. 3,783,151; 3,759,809 and 3,825,479, all to Carlick et al. Radiation curable compositions including isocyanate modified esters and reactive diluents are commercially available as over print varnishes from Sun Chemical Corp., Carlstat, N.J., under the trade name of Sun Cure resins.

An example of negative working radiation depolymerizable materials that may be useful in the invention are 3-oximino-2-butanone methacrylate which undergoes main chain scission upon U.V. exposure and poly 4'-alkyl acylophenones. See Reichmanis, E.; Am. Chem. Soc. Div. Org. Coat. Plast. Chem. Prepr. 1980. 43, 243–251 and Lukac, I.; Chmela S., Int. Conf. on Modif. Polym. 5th. Bratislave, Czech. Jul. 3–6, 1979, I.U.P.A.C. Oxford, England 1979, 1, 176–182.

A photoinitiator is generally also required in the radiation sensitive composition. Numerous examples of suitable imaging initiators can be found in the literature. Examples of photoinitiators useful in the present invention include diaryl ketone derivatives, and benzoin alkyl ethers. Where ultraviolet sensitivity is desired, suitable photoinitiators include alkoxy phenyl ketones, o-acylated oximinoketones, polycyclic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, and haloalkanes. In many cases it is advantageous to use a combination of imaging photoinitiators. For ultraviolet sensitivity one desirable combination is a combination of Michler's ketone and benzoin methyl ether (preferred ratio 2:5). Another useful combination is 2,2'-dimethoxy-2-phenylacetophenone, isopropylxanthone and ethyl paradimethylamino-benzoate. The latter is preferably used with TMPTA to provide a radiation sensitive composition.

The amount of photoinitiator in the radiation sensitive composition depends on the particular photosensitive material selected. It must be present in an amount sufficient to initiate polymerization or crosslinking within a short exposure time.

The radiation sensitive composition must make up a large enough proportion of the internal phase to effectively control the release of the image-forming agent following exposure. This generally means that the radiation sensitive material must constitute approximately 40 to 99% by weight of the internal phase of the capsules.

In the most typical case, color images are formed by image-wise releasing a color former from the capsules. In this case, in addition to the radiation sensitive composition, the internal phase usually includes the color former. Typical examples of color formers useful in the present invention in providing photosensitive or pressure-sensitive systems include colorless electron donating type compounds. Representative examples of such color formers include substantially colorless compounds having in their partial skeleton a lactone, a lactam, a sultone, a spiropyran, an ester or an amido structure such as triarylmethane compounds, bisphenylmethane compounds, xanthene compounds, fluorans, thiazine compounds, spiropyran compounds and the like. Crystal Violet Lactone and Copikem IV and XI™ (all products of Hilton-Davis Co.) are often used alone or in combination as color formers in the present invention. Numerous other examples can be found in the carbonless paper art.

Color formers represent only one type of image-forming agent which may be incorporated in or otherwise associated with the capsules of the present invention. Depending on the nature of the imaging material, other image-forming agents including colored dyes, pigments, metal salts and chelating agents may be incorporated into the capsules. The image-forming agent can be incorporated in a separate layer of the imaging sheet instead of in the capsules and activated by the release of the internal phase from the capsules. For example, the released internal phase may act as a solvent for an image-forming agent otherwise associated with the capsules.

Useful color developer materials for preparing the self-contained sheets of the present invention include clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert butyl salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof. These compounds are generally referred to as electron accepting type compounds.

A preferred developer material is one which has excellent compatibility with the microcapsule slurry solution. Specific examples of useful developers, which have good stability include phenolic resins from Schenectady International, such as HRJ-4250™ and HRJ-4542™.

Any ordinary coating or printing technique may be used to make the pressure-sensitive or photosensitive sheets of the present invention. The techniques described in U.S. Pat. No. 4,010,292 are useful.

The substrate upon which the capsules are coated may be paper (e.g., commercial impact raw stock, cast-coated paper, chrome-rolled paper, etc.) foil, or a plastic film (e.g., a PET film). The photosensitive microcapsules may be utilized in a self-contained imaging system as described in U.S. Pat. No. 5,783,353, wherein the imaging layer is enclosed between two supports to form an integral unit. Alternatively, the microcapsules can be used in conjunction with a developer material to form a self-contained imaging layer applied to a support which is coated with a protective coating to provide benefits similar to those obtained using the two support self contained construction.

In addition to the radiation-sensitive composition and a color former, the internal phase may also include a diluent oil to adjust the tonal properties of the imaging sheet (i.e., the transfer sheet or the self-contained sheet). Representative examples of useful diluent oils are alkylated biphenyls (e.g., monoisopropyl-biphenyl), polychlorinated biphenyls, castor oils, dibutyl phthalate, dibutyl fumerate, brominated paraffin and mixtures thereof. Alkylated biphenyls are generally less toxic and preferred.

Imaging sheets incorporating the photosensitive capsules of the present invention are used by image-wise exposing them to actinic radiation and rupturing the capsules. As explained in the aforementioned commonly assigned patents, it is likely that images are formed by a combination of mechanisms whereby more capsules rupture in the exposed or unexposed areas depending upon whether the imaging material is a positive working or a negative working material, and the capsules which rupture release their contents in proportion to the degree of exposure. Reference may be made to U.S. Pat. No. 4,399,209 to Sanders et al for a discussion of imaging mechanics. The capsules are usually ruptured by pressure (e.g., by passing the exposed sheet through pressure rolls), but may also be ruptured by other means such as solvent vapor, ultrasound, abrasion, and the like.

The present invention is illustrated in more detail by the following non-limiting examples.

EXAMPLE 1

Microencapsulation with Synthetic Viscosity Modifier in the External Phase

Melamine-formaldehyde microcapsules were prepared as follows:

a. Into a 2000 ml stainless steel beaker, 110 g water and 4.6 g dry sodium salt of polyvinylbenzenesulfonic acid (VERSA) were weighed.

b. The beaker was clamped in place on a hot plate under an overhead mixer. A six-bladed, 45° pitch, turbine impeller was used on the mixer.

c. After thoroughly mixing for 45 minutes, 5 g PEMULEN TR-1™ was slowly sifted into the beaker. This mixture was slowly stirred for 2 hours at room temperature (800–1200 rpm).

d. The pH was adjusted to 6.0 with 2% sodium hydroxide.

e. The mixer was turned up to 4000 rpm and the internal phase was added over a period of 10–15 seconds. Emulsification was continued for 10 minutes. Cyan phase was emulsified at 45°–50° C. (oil), 25°–30° C. (water).

f. At the start of emulsification, the hot plate was turned up so heating continued during emulsification.

g. After 20 minutes, the mixing speed was reduced to 2000 rpm, and a solution of melamine-formaldehyde prepolymer was slowly added. This prepolymer was prepared by adding 6.5 g formaldehyde solution (37%) to a dispersion of 3.9 g melamine in 44 g water. After stirring at room temperature for 1 hour, the pH was adjusted to 8.5 with 5% sodium carbonate and then heated to 62° C. until the solution became clear (30 minutes).

h. The pH was adjusted to 6.0, using 5% phosphoric acid. The beaker was then covered with foil and placed in a water bath to bring the temperature of the preparation to 75° C. When 75° C. was reached, the hot plate was adjusted to maintain this temperature for a two hour cure time during which the capsule walls were formed.

i. After curing, mixing speed was reduced to 1800 rpm, formaldehyde scavenger solution (7.7 g urea and 7.0 g water) was added and the solution cured another 40 minutes.

j. After 40 minutes hold time, the mixer rpm was reduced to 1100 and the pH of the batch was adjusted to 9.5 using a 20% NaOH solution. The batch was stirred at 500 rpm overnight at room temperature.

Microcapsules were prepared as above for use in a monochrome imaging sheet using the Cyan internal phase composition set forth below:

| CYAN CAPSULE INTERNAL PHASE (650 NM) | |
|---|---|
| TMPTA | 114.50 g |
| DPHPA | 49.10 g |
| Irganox B900 (anti-oxidant) | 0.164 g |

-continued

| CYAN CAPSULE INTERNAL PHASE (650 NM) | |
|---|---|
| Theeda (chain extender) | 0.32 g |
| Photoinitiator | 0.85 g |
| Bis-(p-chlorophenyl)disulphide | 1.10 g |
| 2,6-Diisopropyldimethylaniline | 7.63 |
| CP220 (Cyan Precursor from Yamada Chemical Co. Jpn.) | 17.5 g |

EXAMPLE 2 (COMPARATIVE)

A microcapsule composition similar to that of Example 1 was prepared, except the 5 grams of Pemulen was replaced with 4 grams of pectin in accordance with a standard prior art process.

Duplicate batches of microcapsules were prepared in accordance with Examples 1 and 2. Particle size data for the microcapsule batches are provided in Table 1.

TABLE 1

| MICROCAPSULE PARTICLE SIZE | | | | |
|---|---|---|---|---|
| | Invention | | Prior Art | |
| | Example 1A | Example 1B | Example 2A | Example 2B |
| Mean ($\mu$) | 5.97 | 6.20 | 6.02 | 5.93 |
| Median ($\mu$) | 5.86 | 5.97 | 5.78 | 5.67 |
| Mode ($\mu$) | 7.48 | 6.82 | 7.00 | 9.63 |
| % > 2.5$\mu$ | 91.6 | 92.0 | 87.4 | 87.1 |
| % > 5$\mu$ | 62.3 | 63.3 | 58.7 | 57.7 |
| % > 7.5$\mu$ | 26.7 | 28.0 | 31.0 | 30.4 |
| % > 10$\mu$ | 5.89 | 6.3 | 10.2 | 9.2 |
| % > 15$\mu$ | 0.4 | 0.1 | 0.5 | 0.4 |

As indicated in Table 1, the microcapsules prepared in accordance with the present invention are characterized by a narrower particle size distribution as compared to the microcapsules prepared in accordance with the prior art. Preparation of microcapsules using a carboxyvinyl viscosity modifier results in fewer "fines" (microcapsules less than 2.5 microns) and fewer microcapsules larger than 10 microns.

EXAMPLE 3

Microcapsules prepared in accordance with Example 1 are mixed with developer to be coated as a monochrome coating based on the following formulation:

| Monochrome Coating Composition | |
|---|---|
| Cyan Capsules | 2.842 g |
| Tinopal | 0.109 g |
| Sequarez 755 | 0.257 g |
| HRJ 4250 Resin ™ | 11.40 g |

The monochrome coating composition is coated on a PET film support and a second PET support is laminated over the coating composition to form an imaging assembly.

EXAMPLE 4 (COMPARATIVE)

An imaging assembly is prepared in a manner similar to that of Example 3 except that the microcapsules used are the prior art pectin-containing microcapsules from Example 2.

Sensitometric response curves were generated for imaging media prepared in accordance with Examples 3 and 4. Sensitometric data for the imaging media conditioned 5 days at 20% RH, 50% RH, and 80% RH are provided in Tables 2–5.

TABLE 2

| Example 3A (Invention) | | | | | |
|---|---|---|---|---|---|
| Cyan | 5d 21/50 | 5d 21/20 | Delta | 5d 21/80 | Delta |
| Dmax | 2.01 | 2.08 | 0.07 | 2.04 | 0.03 |
| Dmin | 0.12 | 0.12 | 0.00 | 0.12 | 0.00 |
| D_90 | 2.69 | 2.68 | −0.01 | 2.71 | 0.02 |
| D_50 | 3.39 | 3.36 | −0.03 | 3.39 | 0.00 |
| D_10 | 3.82 | 3.82 | 0.00 | 3.81 | −0.01 |
| Gamma | 1.34 | 1.38 | 0.04 | 1.40 | 0.06 |
| Range | 1.13 | 1.14 | 0.01 | 1.10 | −0.03 |
| % Range Change | | | 0.6% | | −2.8% |

TABLE 3

| Example 3B (Invention) | | | | | |
|---|---|---|---|---|---|
| Cyan | 5d 21/50 | 5d 21/20 | Delta | 5d 21/80 | Delta |
| DMax | 2.06 | 2.06 | 0.01 | 2.04 | −0.02 |
| DMin | 0.12 | 0.12 | 0.00 | 0.13 | 0.01 |
| D_90 | 2.70 | 2.72 | 0.02 | 2.73 | 0.04 |
| D_50 | 3.43 | 3.36 | −0.08 | 3.42 | −0.02 |
| D_10 | 3.83 | 3.82 | −0.01 | 3.82 | −0.01 |
| Gamma | 1.36 | 1.41 | 0.05 | 1.41 | 0.04 |
| Range | 1.14 | 1.10 | −0.03 | 1.09 | −0.05 |
| % Range Change | | | −2.9% | | −4.1% |

TABLE 4

| Example 4A (Prior Art) | | | | | |
|---|---|---|---|---|---|
| Cyan | 5d 21/50 | 5d 21/20 | Delta | 5d 21/80 | Delta |
| DMax | 1.83 | 1.91 | 0.08 | 1.84 | 0.02 |
| DMin | 0.13 | 0.14 | 0.01 | 0.14 | 0.01 |
| D_90 | 2.51 | 2.56 | 0.05 | 2.50 | 0.00 |
| D_50 | 3.19 | 3.22 | 0.03 | 3.12 | −0.06 |
| D_10 | 3.63 | 3.88 | 0.25 | 3.55 | −0.08 |
| Gamma | 1.20 | 1.07 | −0.13 | 1.30 | 0.10 |
| Range | 1.13 | 1.32 | 0.19 | 1.05 | −0.08 |
| % Range Change | | | 17.0% | | −6.9% |

TABLE 5

| Example 4B (Prior Art) | | | | | |
|---|---|---|---|---|---|
| Cyan | 5d 21/50 | 5d 21/20 | Delta | 5d 21/80 | Delta |
| DMax | 1.82 | 1.92 | 0.11 | 1.80 | −0.02 |
| DMin | 0.13 | 0.13 | 0.00 | 0.14 | 0.01 |
| D_90 | 2.50 | 2.55 | 0.05 | 2.51 | 0.01 |
| D_50 | 3.20 | 3.19 | 0.00 | 3.14 | −0.06 |
| D_10 | 3.62 | 3.85 | 0.23 | 3.55 | −0.07 |
| Gamma | 1.20 | 1.10 | −0.10 | 1.27 | 0.07 |
| Range | 1.12 | 1.30 | 0.18 | 1.05 | −0.08 |
| % Range Change | | | 15.9% | | −6.8% |

Figure 1B:
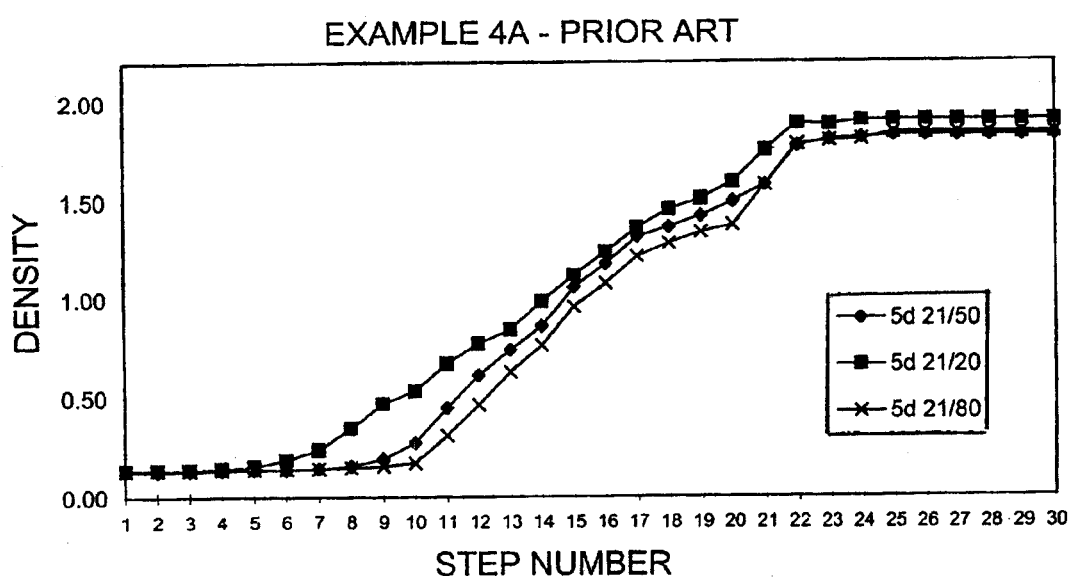

The imaging media prepared using microcapsules containing a carboxyvinyl polymer viscosity modifier exhibits improved stability under varying humidity conditions. Sensitometric curves illustrating the results for Example 3A and 4A are provided in FIG. 1. Microcapsules prepared in accordance with the present invention provide a relatively stable sensitometric response over a wide range of humidity conditions. By contrast, the prior art microcapsules exhibit a significant change in sensitometric characteristics under different humidity conditions particularly in the toe region of the H & D curve. The ability to provide imaging media having similar sensitometric responses over a wide range of humidity conditions is essential to producing high quality images from a printer being used under different environmental conditions.

The improvement obtained by incorporating a carboxyvinyl polymer viscosity modifier in the production of photosensitive microcapsules is perhaps best illustrated by comparing the shift in toe speed of the imaging media under different humidity conditions. As indicated in Table 6, microcapsules prepared in accordance with the present invention provide relatively stable toe speeds from 20% RH to 80% RH. The prior art microcapsules, by contrast, show a significant shift in toe speed from 20% RH to 80% RH.

TABLE 6

| Example | Toe Speed Shifts | | | |
| --- | --- | --- | --- | --- |
| | 21/20 | 21/50 | 21/80 | Range |
| 3A (Invention) | 3.82 | 3.82 | 3.81 | 0.01 |
| 3B (Invention) | 3.82 | 3.83 | 3.82 | 0.01 |
| 4A (Prior Art) | 3.88 | 3.63 | 3.55 | 0.33 |
| 4B (Prior Art) | 3.85 | 3.62 | 3.55 | 0.30 |

Figure 2A:
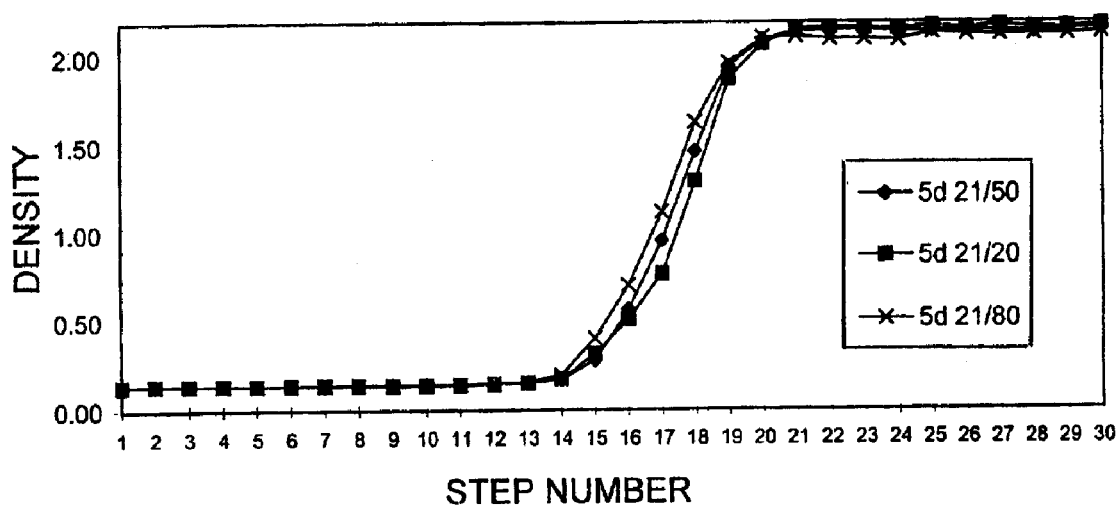
FIG. 2 illustrates the sensitometric response for microcapsules prepared in accordance with the present invention (FIG. 2a) compared to microcapsules prepared using pectin as a viscosity modifier (FIG. 2b) for magenta monochrome stored under various humidity conditions (20% RH, 50% RH, and 80% RH)
Figure 2B:
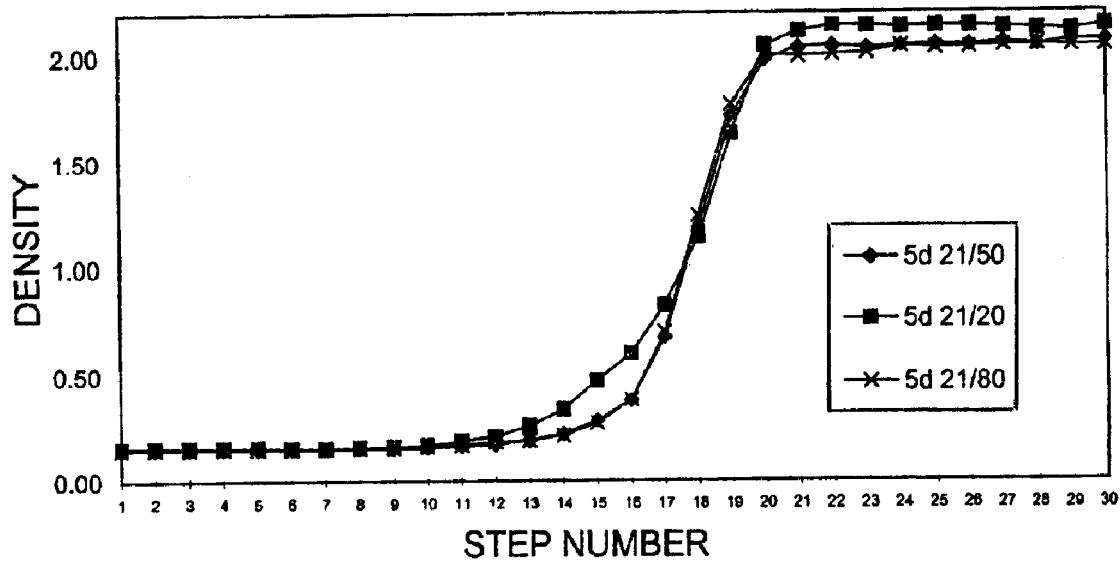
Figure 3A:
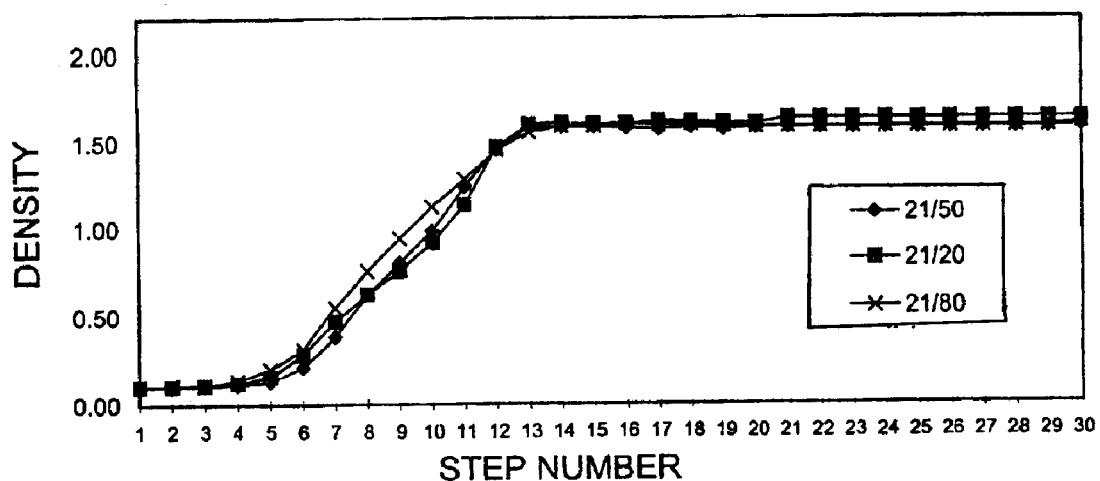
FIG. 3 illustrates the sensitometric response for microcapsules prepared in accordance with the present invention (FIG. 3a) compared to microcapsules prepared using pectin as a viscosity modifier (FIG. 3b) for yellow monochromemedia stored under various humidity conditions (20% RH, 50% RH, and 80% RH)
Figure 3B:
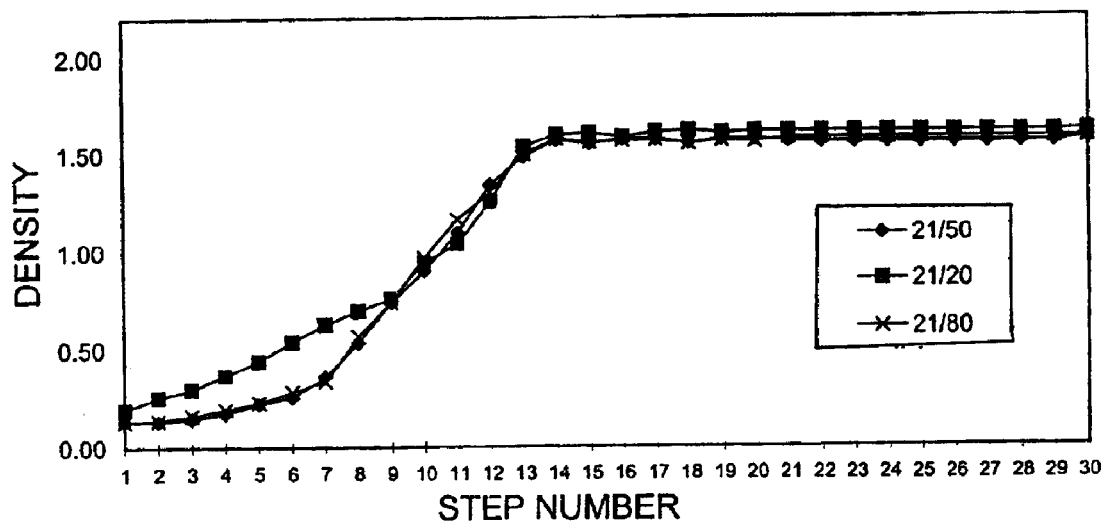

FIGS. 2 and 3 also illustrate the improvement in toe speed obtained by using a carboxyvinyl polymer in the aqueous phase for magenta and yellow monochrome microcapsules, respectively.

The improved sensitometric response associated with the use of a carboxyvinyl polymer viscosity modifier facilitates color correction because there are fewer distortions in the H & D curve shape that have to be accounted for during imaging. Accordingly, microcapsules prepared in accordance with the present invention are particularly useful in forming photosensitive imaging sheets because of their relatively uniform small size and insensitivity to changes in humidity.

Figure 4A:
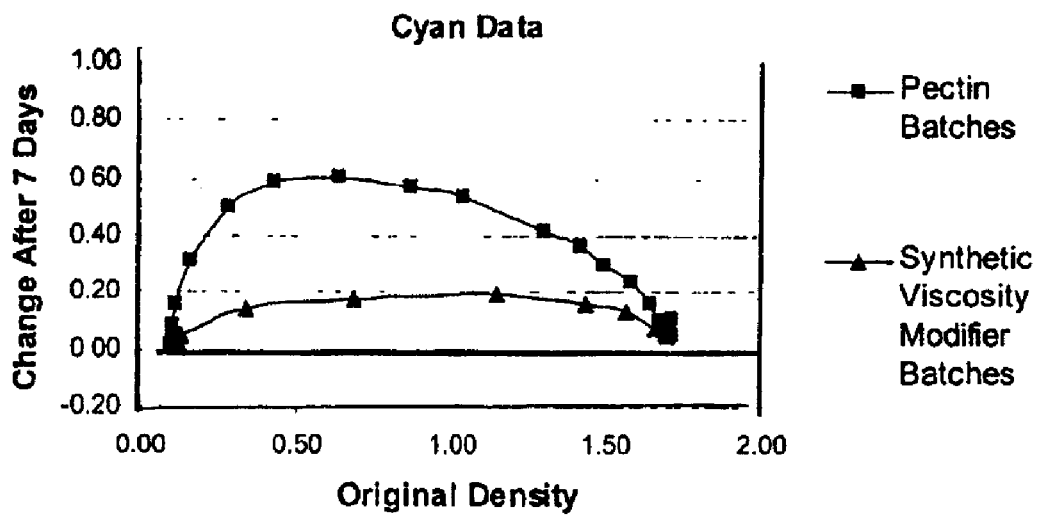
FIGS. 4a–4c illustrate the improvement in image retention obtained by using a synthetic viscosity modifier in place of pectin.
Figure 4B:
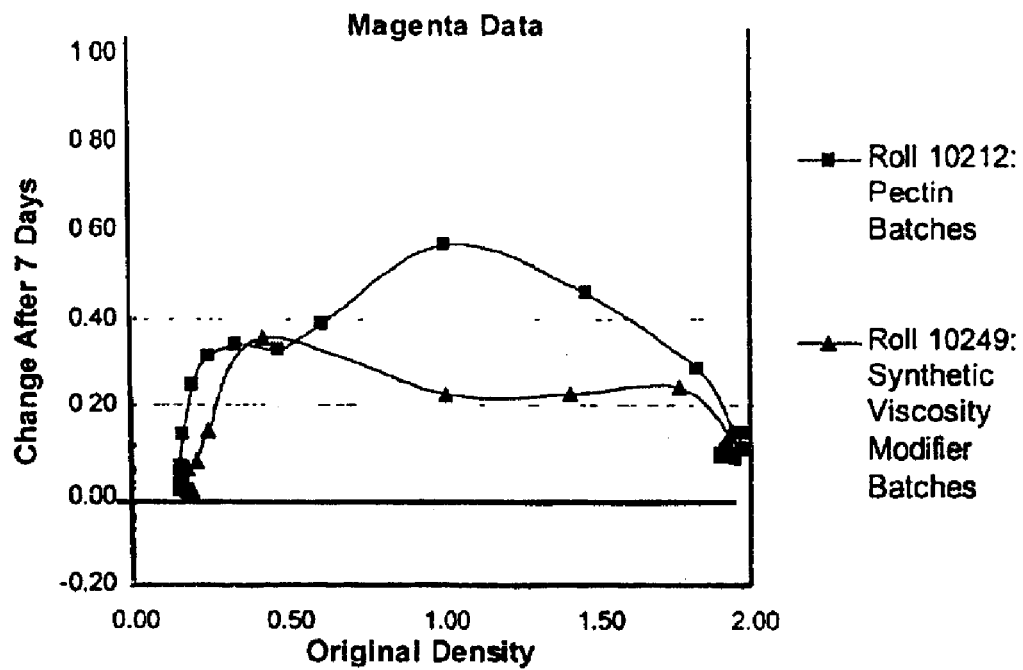
Figure 4C:
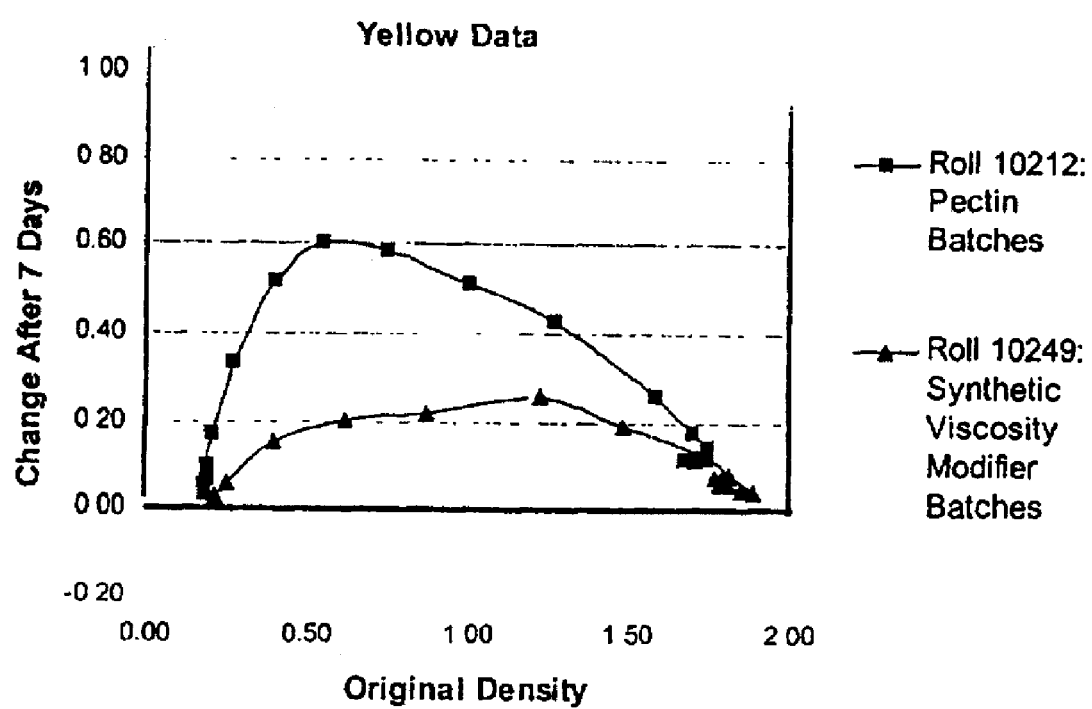

Image stability or archivability is improved by incorporating a carboxyvinyl polymer in the continuous phase during production of photosensitive microcapsules. Printed images on conventional media during storage have a tendency to develop more residual color thereby resulting in color contamination and/or dark images. Microcapsule batches prepared using the synthetic viscosity modifiers as described herein provide imaging media exhibiting improved image retention and minimal development of residual color. The improvement in image retention is shown in Table 7. Printed images exposed to elevated temperatures for seven days were evaluated to determine the change in density. The increase in density observed with the prior art pectin-based batches was significantly greater than that for the batches prepared in accordance with the present invention. FIGS. 4a–4c illustrate the change in density as a function of original density for cyan, magenta and yellow microcapsules, respectively, of prior art microcapsules compared to microcapsules prepared using a synthetic viscosity modifier in accordance with the present invention.

TABLE 7

50/50 Image Retention
SS-4 Images
Maximum Change 1 Day @ 21° C./50% RH to
7 Days @ 50° C. 5-% RH

| Description | C | M | Y |
| --- | --- | --- | --- |
| Pectin Batches (Prior Art) | 0.61 | 0.57 | 0.60 |
| Synthetic Viscosity Modifier Batches Invention | 0.19 | 0.36 | 0.26 |

Having described the invention in detail and by reference to specific embodiments thereof, it will be apparent that numerous modifications and variations are possible without departing from the scope of the invention defined by the following claims.

What is claimed is:

1. A process for forming photosensitive microcapsules having discrete capsule walls comprising the steps of forming an emulsion of an oily core material in a continuous aqueous phase comprising an aqueous solution of a carboxyvinyl polymer and enwrapping particles of said oily core material in an amine-formaldehyde condensation product produced by in situ condensation of an amine and formaldehyde wherein said carboxyvinyl polymer comprises a crosslinked polymer of acrylic acid.

2. The process of claim 1 wherein said carboxyvinyl polymer is present in said aqueous phase in an amount of about 1.0 to 8% by weight based on the amount of water in the aqueous phase.

3. The process of claim 2 wherein said carboxyvinyl polymer is present in said aqueous phase in an amount of about 2 to 4%.

4. The process of claim 1 wherein said formaldehyde condensation product is a melamine-formaldehyde resin.

5. The process of claim 1 wherein said carboxyvinyl polymer comprises a copolymer of acrylic acid and $C_{10}$–$C_{30}$ alkyl acrylate crosslinked with a crosslinking monomer selected from the group consisting of polyalkenyl ethers and divinyl glycol.

6. The process of claim 5 wherein said crosslinking monomer is allylpentaerythritol.

7. The process of claim 1 wherein said aqueous phase further contains a sulfonated polystyrene.

8. The process of claim 1 wherein said microcapsules have an average particle size in a range from about 4 to 8 microns.

9. The process of claim 8 wherein at least 90% of said microcapsules have a particle size less than 10 microns.

10. The process of claim 9 wherein said microcapsules have an average particle size of about 5 microns.

11. The process of claim 1 wherein said core material is a photopolymerizable composition.

12. The process of claim 11 wherein said photopolymerizable composition contains an ethylenically unsaturated compound.

13. An imaging sheet comprising a first support carrying on one surface thereof an imaging layer comprising an aqueous phase, a developer and microcapsules having discrete capsule walls, said microcapsules containing a radiation-sensitive material in the internal phase and containing an aqueous solution of a carboxyvinyl polymer as a viscosity modifier in the aqueous phase, said microcapsules being formed by enwrapping particles of an oil-in-water emulsion in a formaldehyde condensation product produced by in situ polymerization of formaldehyde and an amine, wherein said carboxyvinyl polymer comprises a crosslinked polymer of acrylic acid.

14. The imaging sheet of claim 13 wherein said sheet further comprises a protective coating layer overlying said imaging layer.

15. The imaging sheet of claim 13 further comprising a second support wherein said imaging layer is positioned between said supports.

16. The imaging sheet of claim 13 wherein said formaldehyde condensation product is a melamine-formaldehyde resin.

17. The imaging sheet of claim 13 wherein said carboxyvinyl polymer is present in said aqueous phase in an amount of about 1.0 to 8% by weight based on the amount of water in the aqueous phase.

18. The imaging sheet of claim 13 wherein said carboxyvinyl polymer comprises a copolymer of acrylic acid and $C_{10}$–$C_{30}$ alkyl acrylate crosslinked with a crosslinking monomer selected from the group consisting of polyalkenyl ethers and divinyl glycol.

19. The imaging sheet of claim 18 wherein said crosslinking monomer is allylpentaerythritol.

20. Photosensitive microcapsules exhibiting improved sensitometric response under a range of humidity conditions, said microcapsules having discrete capsule walls and comprising an internal phase encapsulated in a continuous aqueous phase wherein said internal phase comprises a photohardenable composition and a color former; and said aqueous phase comprises an aqueous solution of a carboxyvinyl synthetic viscosity modifier comprising a crosslinked polymer of acrylic acid, wherein said photosensitive microcapsules provide substantially the same sensitometric response over a relative humidity range of from about 20% RH to 80% RH.

* * * * *